US006849126B2

(12) United States Patent
Moore et al.

(10) Patent No.: US 6,849,126 B2
(45) Date of Patent: Feb. 1, 2005

(54) MACHINE FOR COATING HOLLOW BODIES

(75) Inventors: Rodney Moore, Gardener, MA (US); Hugh Smith, Brampton (CA); Andreas Luettringhaus-Henkel, Darmstadt (DE)

(73) Assignee: Tetra Laval Holdings & Finance S.A., Pully (CH)

( * ) Notice: Subject to any disclaimer, the term of this patent is extended or adjusted under 35 U.S.C. 154(b) by 73 days.

(21) Appl. No.: 10/204,957

(22) PCT Filed: Mar. 1, 2001

(86) PCT No.: PCT/EP01/02292
§ 371 (c)(1),
(2), (4) Date: Aug. 27, 2002

(87) PCT Pub. No.: WO01/66818
PCT Pub. Date: Sep. 13, 2001

(65) Prior Publication Data
US 2004/0025785 A1 Feb. 12, 2004

(30) Foreign Application Priority Data
Mar. 3, 2000 (DE) ........................................ 100 10 642

(51) Int. Cl.$^7$ ............................. C23C 16/00; H05H 1/02
(52) U.S. Cl. ............... 118/254; 118/255; 118/723 MW; 427/476
(58) Field of Search ................................. 118/254, 255, 118/256, 723 MW; 427/476; 156/345.41

(56) References Cited
U.S. PATENT DOCUMENTS 5,565,248 A   10/1996  Plester et al. ............... 427/571
5,849,366 A * 12/1998  Plester ........................ 427/491
6,149,982 A * 11/2000  Plester ........................ 427/491
6,565,791 B1 *  5/2003  Laurent ....................... 264/455

FOREIGN PATENT DOCUMENTS

| EP | 1 010 773 | 6/2000 | |
| WO | 95/22413 | 8/1995 | |
| WO | 98/40531 | 9/1998 | |
| WO | WO 9917334 A1 * | 4/1999 | ............ H01J/37/32 |

* cited by examiner

Primary Examiner—Parviz Hassanzadeh
(74) Attorney, Agent, or Firm—Michael L. Dunn

(57) ABSTRACT

A machine for simultaneously coating the inner surface of several hollow bodies wherein the machine has a frame holding a hollow body bearing plate having fixed points disposed next to one another in the form of a matrix and a tube support plate having vertically disposed gas feed tubes corresponding with the fixing points, a dividing wall that is also vertically disposed having matching holes corresponding with the fixing points placed next to one another in the form of a matrix and a quartz window fixed on the frame. The bearing and support plates are provided with a drive mechanism for horizontal movement into and out of a treatment chamber for gas treatment in the chamber and for loading and unloading out of the chamber. The dividing wall, the hollow body bearing plate, the tube support plate and other functional accessories form a first module secured to the frame and a second module is provided on the frame imaging the first module. Microwave units are disposed in the form of a matrix between the first and second modules.

20 Claims, 9 Drawing Sheets

MACHINE FOR COATING HOLLOW BODIES

Figure 1:
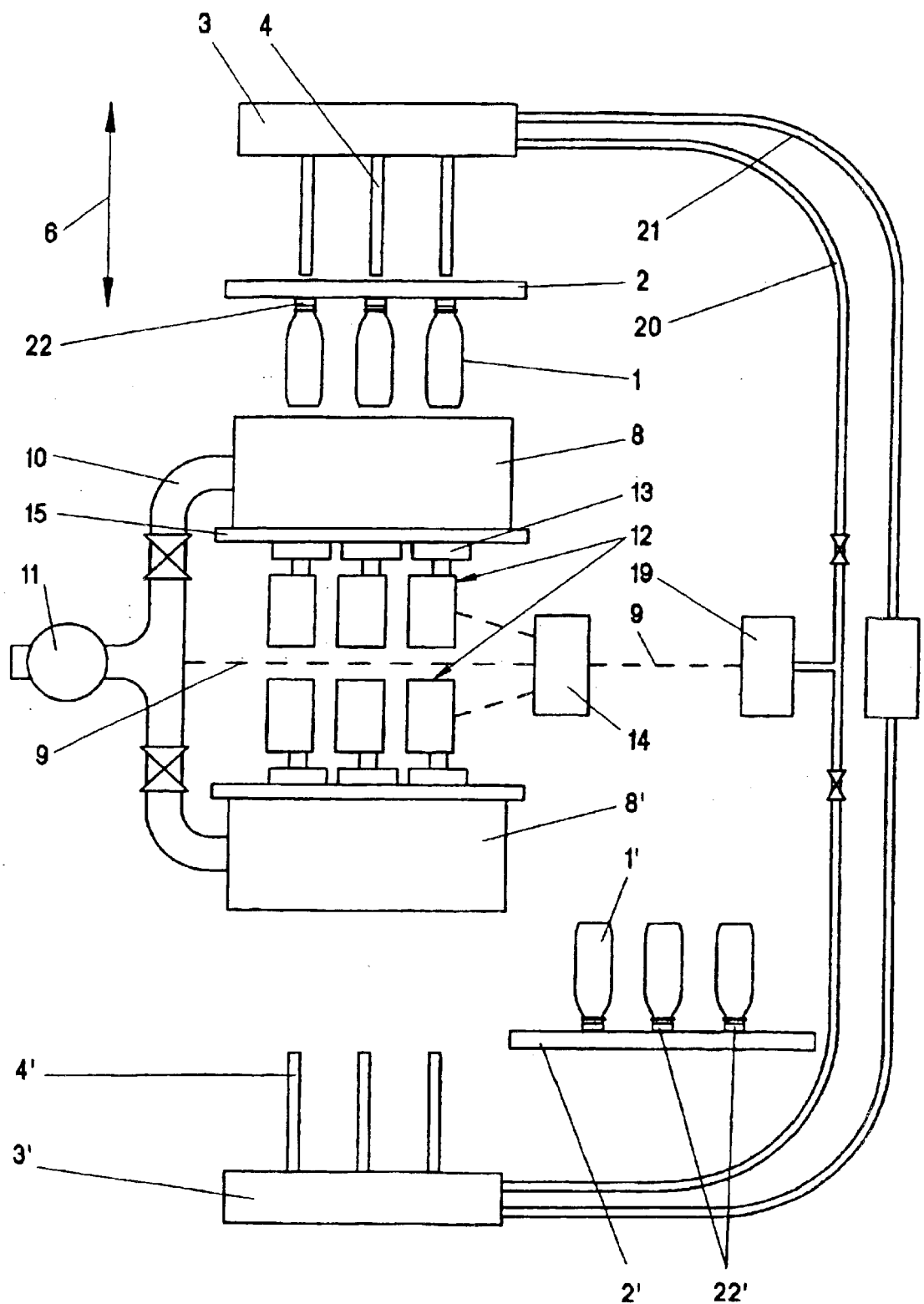

The invention concerns a machine for simultaneously coating the internal surface of a plurality of hollow bodies which are held on a substantially flat hollow body carrier plate in such a way that a respective gas feed tube for process gas which is secured to a substantially flat tube support plate can be introduced into the hollow body and the unit comprising the carrier plate and the support plate arranged parallel thereto can be moved into and out of the respective evacuatable treatment chamber, wherein the treatment chamber for each hollow body is equipped with a microwave unit with resonator.

In order to render plastic hollow bodies, for example PET bottles, impermeable in relation to low-molecular gases such as for example oxygen, it is known for the PET-bottles to be internally provided with a coating, for example an $SiO_x$-layer, because that has good barrier properties in relation to low-molecular gases. For that internal coating operation, a process gas mixture is blown by way of a gas feed tube into the interior of the PET-bottle which was previously evacuated, and by means of microwave energy it is possible to fire that plasma and coat the internal surfaces of the bottle.

In the laboratory and also already on a larger scale, PET-bottles have been coated by way of the use of microwave energy. It is also already known for a plurality of hollow bodies to be simultaneously internally coated, using a machine similar to the kind set forth in the opening part of this specification. In the case of that known machine, plastic bottles are fitted with their opening downwardly onto a flat hollow body carrier plate in such a way that the respective bottle neck is held by the carrier plate. The carrier plate itself is disposed horizontally like a tray and a row of bottles extends vertically with their bottoms upwardly in such a way that a vertically upstanding gas feed tube can be introduced from below upwardly through the bottle neck from a flat tube support plate which is also arranged horizontally. The gas feed tubes are also arranged in a row vertically on the horizontal tube support plate, like the row of bottles to be coated. For the operating procedure the carrier plate has to be moved from a first horizontal position into a second horizontal position, in the second position the tube support plate is moved vertically into conjunction with the carrier plate and the unit consisting of those two plates, after they have been brought together, are further moved in a vertical direction into an evacuatable treatment chamber and, after the treatment, moved out of same. Thereafter the carrier plate is also again retracted horizontally and special devices are required to release the coated bottles from the carrier plate and to strip them therefrom. By virtue of the horizontal arrangement of the carrier plate and the tube support plate, the amount of space required by such a coating machine is large. The unloading operation is also complicated and expensive.

Therefore the object of the invention is to increase the output of the machine described in the opening part of this specification and nonetheless to permit the machine to be of a more compact overall structure while requiring a corresponding smaller amount of space. In that respect the invention seeks to provide that in particular more hollow bodies per machine unit can be coated in one operating cycle.

In accordance with the invention that object is attained in that:

1. the hollow body carrier plate with fixing places arranged in mutually juxtaposed matrix-like relationship and the tube support plate with gas feed tubes arranged in corresponding relationship with respective ones of said fixing places are oriented vertically,
2. also vertically oriented a separating wall with holes arranged in correspondingly matching matrix-like mutually juxtaposed relationship and having quartz windows is fixed to the machine frame,
3. the carrier plate and the support plate are provided with a drive for horizontal movement thereof into the machine and out of the machine for loading and unloading,
4. the separating wall, the hollow body carrier plate and the tube support plate with their functional accessories form a first module,
5. fixed to the machine frame in mirror-image relationship with the first module is a second module of corresponding structure, and
6. the microwave units arranged in matrix-like configuration are disposed between the modules.

For the purposes of saving space, machines are frequently built upwardly. In the case of the coating machine according to the invention for example all pumps are fitted vertically at the top onto the machine frame. If the amount of space required horizontally is reduced by virtue of the vertical orientation both of the hollow body carrier plate and also the tube support plate, the conduits from the pumps to the individual units can be shorter. The space at the top on the machine frame, which is available due to the reduced horizontal structural area of the machine, is sufficiently large to mount all vacuum assemblies. The individual spaces and chambers to be supplied however are closer together, with the consequence of involving the shorter supply lines.

Both the hollow bodies on the carrier plate and also the gas feed tubes on the tube support plate can be arranged in matrix-like configuration involving one row beside another. Thus a large number of processing places are available in a small space.

If in addition each module is provided with a stationary separating wall which is also arranged vertically for the same space-saving reasons, in this case also it is possible to provide a large number of holes with quartz windows, per unit of surface area. The quartz windows make it possible to separate a for example evacuatable space on the one hand from another space which is for example under atmospheric pressure, on the other hand. At the same time however the quartz windows are transmissive in regard to the microwave energy. In that way lines and antenna can be gas-tightly passed from a supply space into an evacuatable treatment space. Such a separating wall can be of a solid massive structure and can carry comparatively great forces. They arise out of the atmospheric pressure on the outside and the vacuum in the interior of the treatment chamber.

Spindles, slide rails, roller devices and ball bearing assemblies can be used as the drive for the carrier plate and the support plate. For the purposes of loading and unloading the hollow body carrier plate, the carrier plate has to be withdrawn from the machine so that it is easily accessible to fitting units having hollow bodies. Preferably it is possible to provide additional drives, or the same drive can be used to move the carrier plate and the support plate as a unit relative to the fixed separating wall, and to form a treatment chamber which is gas-tightly closed off. It will be appreciated that such a closed chamber is not to be fitted with hollow bodies. For that purpose, it first has to be opened, in which case the drive for withdrawing the plates in the horizontal direction also has to be switched on.

If the design configuration is such that, in accordance with the invention, the separating wall, the hollow body carrier plate and the tube support plate with their functional accessories form a first module, then in accordance with the teaching of the invention it is possible to secure to the machine frame in mirror-image relationship with the first module a second module of corresponding structure, and both modules can be supplied by as many supply devices as possible, which then only have to be provided singly. In that respect, in accordance with the invention, the microwave units which are arranged in a matrix configuration are preferably disposed between the modules.

The functional accessories for constructing the respective module include fixing elements, supply lines, movable and fixed machine elements and the like. For constructing a coating machine in accordance with the invention, it is possible for those accessories to be of the same configuration for each module, and to be installed in the same manner on each module at a suitable location. That can drastically reduce manufacturing and maintenance costs.

A coating machine can be constructed in a very compact fashion, in a very small space, by virtue of the features according to the invention. The entire machine requires a small amount of space in comparison with the known machines having the horizontally arranged hollow body carrier plate which is advanced horizontally into its working position and which is retracted again after the processing procedure has been implemented. Many processing stations can be disposed and arranged matrix-like on a plate, in a comparatively small amount of vertical space, thus affording a high-output coating machine.

The capital investment costs also have a major effect in regard to the arrangement and structure of the pumps. In a configuration which is more easily accessible than in the case of machines covering a large surface area, the vacuum assemblies can be fitted onto the machine frame and the workload of the pumps can be virtually doubled for it is sufficient to have one vacuum unit for two modules, as described above. In that respect, it is not impossible that a relatively large number of modules can also be disposed on a machine frame of suitable design configuration, for example four or six modules which are arranged star-like around the microwave supply.

The microwave units represent a packet of mutually spaced housings with adjoining coupling-out elements and waveguides which can be mounted in a matrix-like fashion in large numbers per unit of surface area on a vertical plate. The important aspect is that, with an appropriately close assembly of two modules, the microwave energy from a generator can be passed selectively into the one module (for example towards the left) and thereafter into the other module (for example towards the right). Then, only one single respective microwave source unit is needed for two corresponding stations (being arranged substantially in mirror-image relationship).

The vertical orientation of the hollow body carrier plate on which the hollow bodies are then arranged in such a way that their longitudinal centre line extends substantially horizontally and the tube support plate provides that, after the coating operation, after which the hollow body carrier plate has been moved into the loading and unloading position, the unloading operation can be easily executed. It is only necessary to introduce ejectors in order to remove the coated hollow bodies from the carrier plate, which can then automatically drop into a collecting container disposed thereebeneath.

It is particularly desirable if instead of only one overall two hollow body carrier plates per module are used. As long as one thereof is disposed in the vacuum chamber, the other can be loaded and unloaded outside. In the course of movement into (or movement out of) the vacuum chamber the plates are then respectively rotated about their vertical axis in order to move the hollow bodies into the correct position for the coating operation.

It is also particularly advantageous in accordance with the invention if a common cooling supply is provided for both modules. For the purposes of temperature control of the microwave units and in particular the housings thereof with current supply, they are desirably to be arranged in a cooling chamber. If now the housings of the individual units are arranged at spacings from each other in a matrix-like configuration with one row beside another and if ventilation gaps and slots are provided in a sufficient quantity and size, then the entire packet of microwave units can be assembled between two modules in an air-conditioning or climatising chamber which surprisingly represents a common cooling supply. If desired the temperatures can be precisely measured and controlled at any point in such a chamber.

It is similarly advantageous if the modular structure in accordance with the invention is utilised to provide a common gas supply for both modules (possibly for a correspondingly larger number of the modules involved). That supply means the supply of the process gas. For production of the plasma process gas is urged in per se known manner out of feed conduits into the gas feed tube from which the process gas then passes into the hollow body to be coated. Both for manufacture and also for operation of a coating machine of the kind described herein, it is apparent that the possibility of a common gas supply for all the modules provided is of interest from a financial point of view (capital investment costs) and a technical point of view.

It is also advantageous if a common power supply is provided for both modules (or for the larger number of modules). The power supply can be respectively disposed in the centre between each two modules, with the advantage of shorter line lengths and improved switching options. It is known that the high voltage change-over switches required for the microwave sources are complicated and expensive. If they switch over alternately from a few volts to the kilovolt range, flashovers occur, which must be controlled in the course of ongoing operation. The fewer such electrical devices have to be provided, the better it is for the coating machine. In accordance with the invention it is desirable here for the arrangement to be such that for example in the case of two units the microwave units are closest to each other. In the case of the arrangement of two units in mirror-image relationship, which is proposed in accordance with the invention, that is achieved by virtue of the central arrangement of the microwave units. That then also has a correspondingly advantageous effect on the power supply.

It has also been found in accordance with the invention that it is particularly desirable if for each hollow body the microwave resonator in question is in the form of a hollow cylinder which is fixed to the separating wall. After the carrier and support plates on the one hand and the separating wall on the other hand have been brought together to form a gas-tight treatment chamber and after evacuation thereof the plates can be better supported by way of the hollow cylinders which are of a massive structure and which act as resonators. If the hollow cylinders are of a suitably strong and stable nature it is possible to use even larger carrier and support plates and separating walls without flexing phenomena occurring. That makes it possible to construct treatment chambers of different dimensions. The vacuum chamber in question can be of a comparatively light structure. In that respect it is to be borne in mind that, with an air pressure of 1 bar, a relatively large separating wall with for example one hundred processing places is subject to a loading which corresponds to the force of a weight of 18 tonnes. Microwave resonators are required in any case. If therefore they are formed as sturdy rugged hollow cylinders with a sheet metal wall thickness of for example 2–8 mm, that arrangement then provides for advantageous support on outside plates.

In accordance with the invention the hollow body carrier plate can also be mounted at a side of a plate turner which is pivotable about a vertical turning axis and then a second hollow body carrier plate can be mounted on the other side of the plate turner. The output of the machine is further increased by those measures. More specifically, when a hollow body carrier plate is already in the vacuum chamber the other hollow body carrier plate is readily accessible outside the machine. It can then be comfortably and conveniently loaded and unloaded. So that the loading procedure (loading and/or unloading) can always be implemented from the same side, the carrier plates can be rotated about a vertical axis by virtue of the fact that they can be mounted to the above-mentioned plate turner. With same they pivot for example through 180°. In that way the hollow bodies are moved into the correct position for the coating operation.

Figure 2:
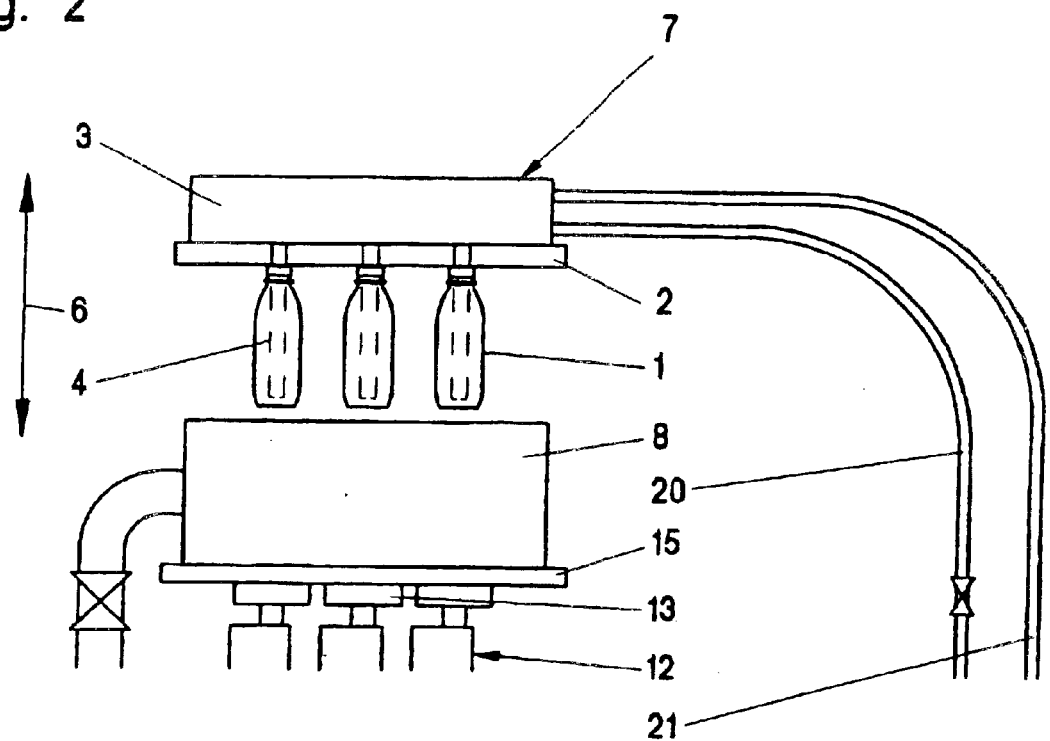
Figure 3:
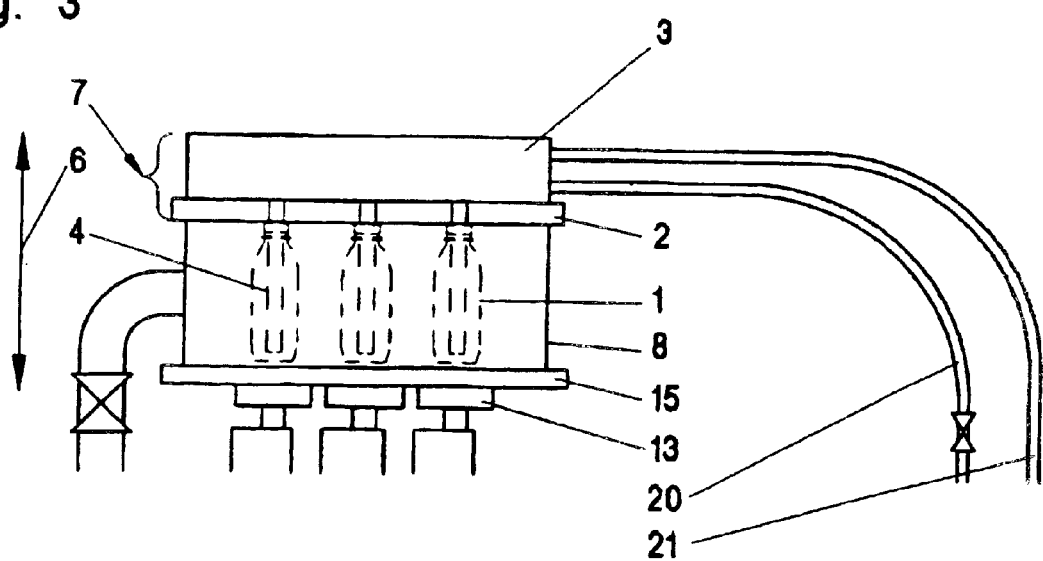
Figure 4:
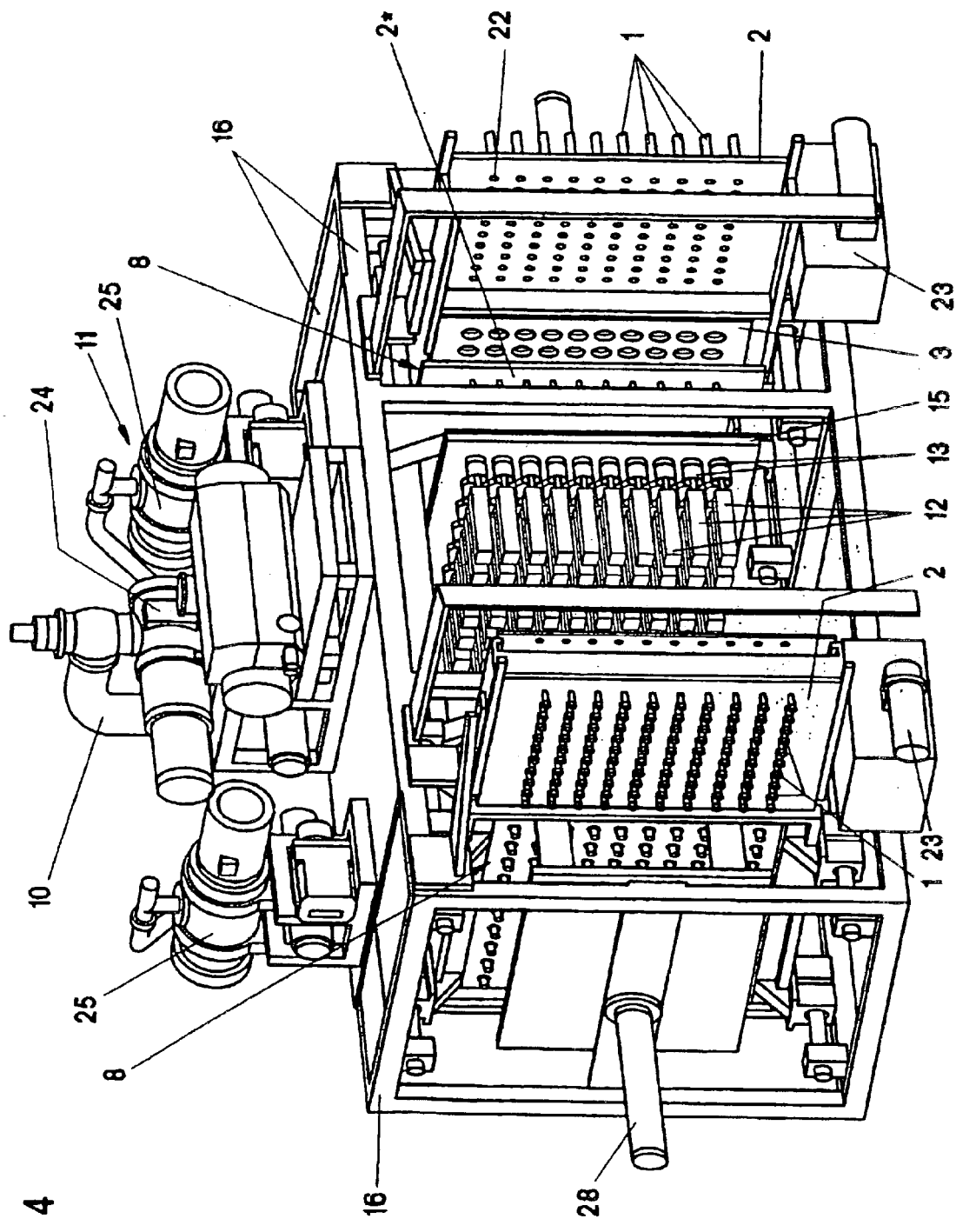
Figure 5:
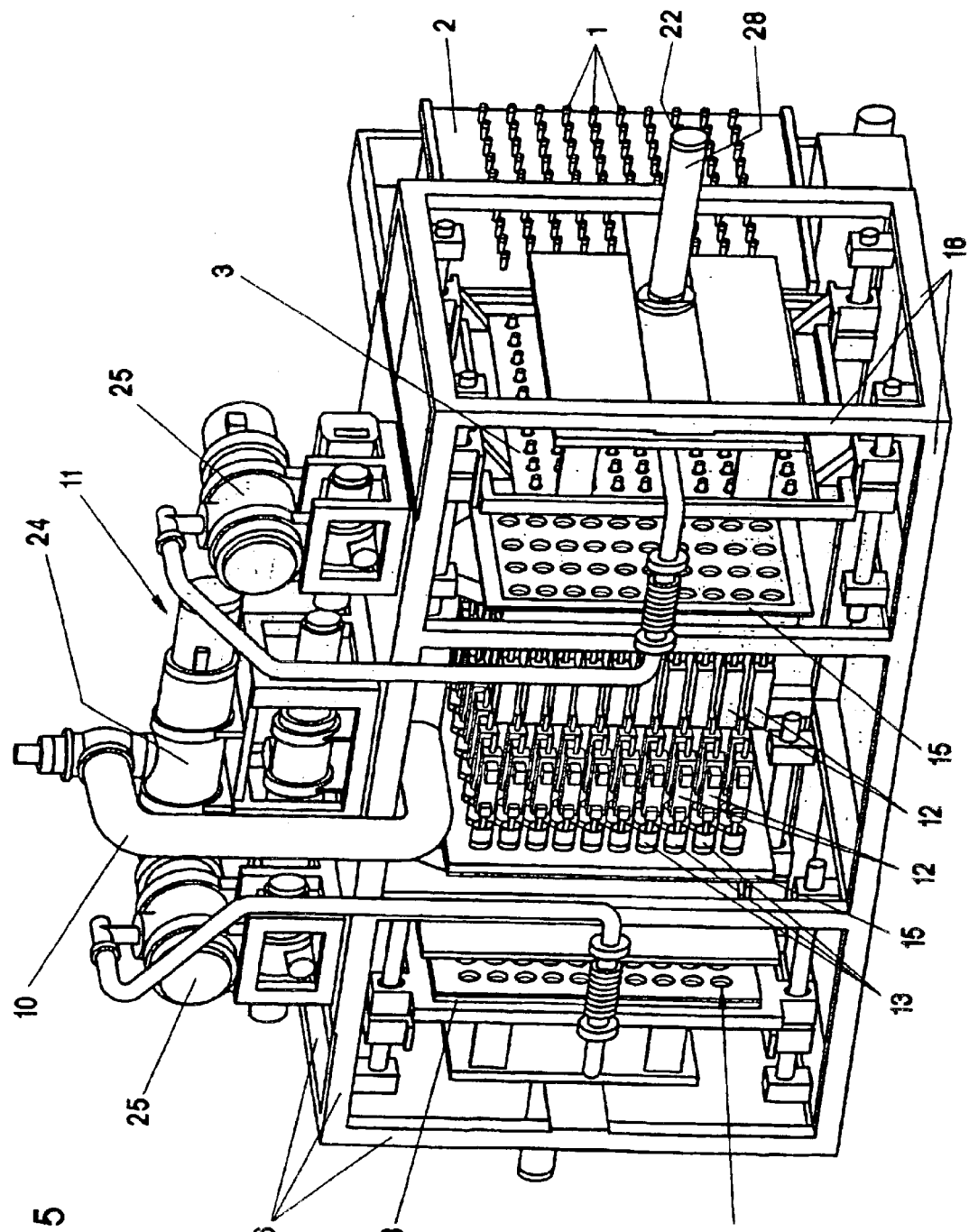
Figure 6:
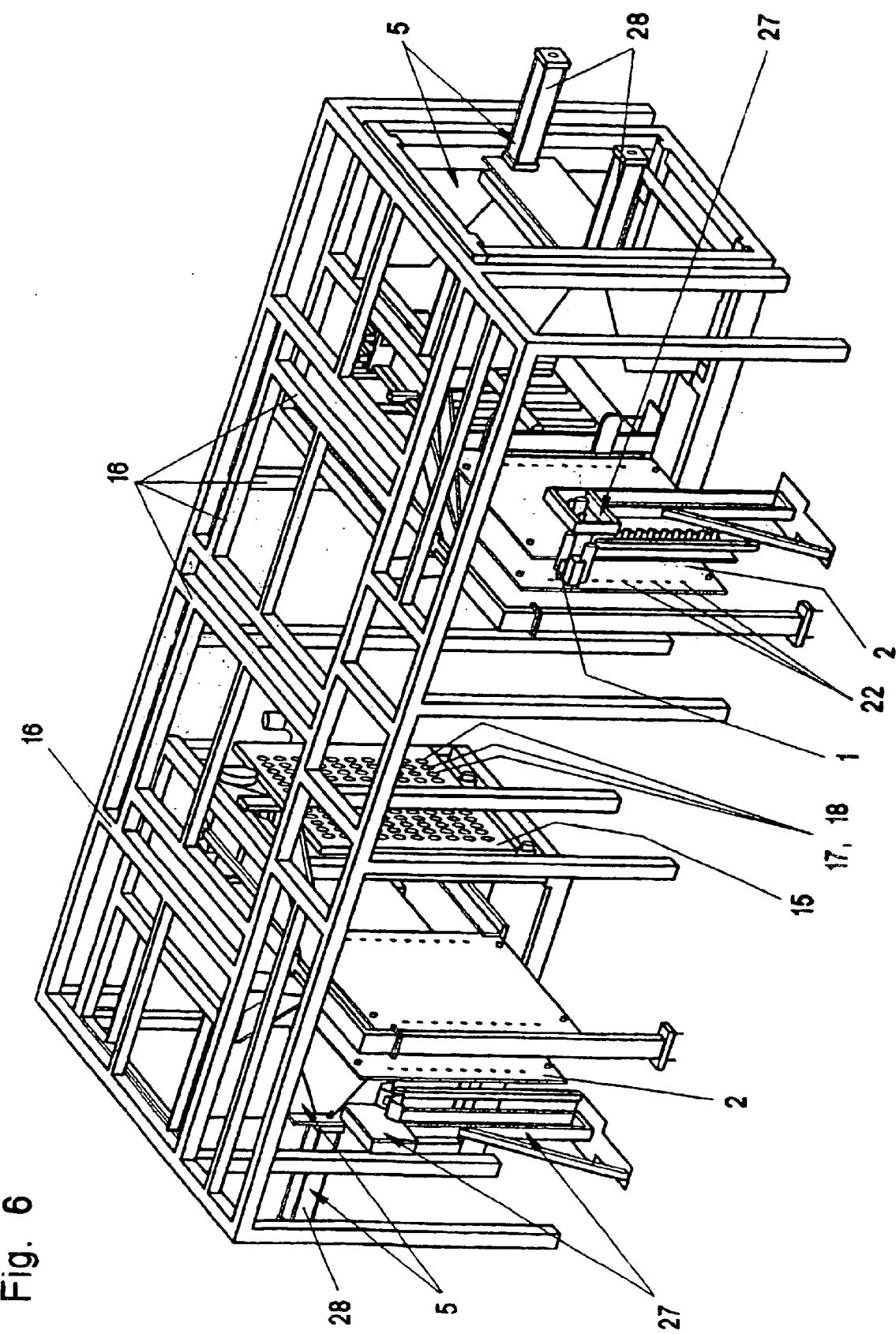
Figure 7:
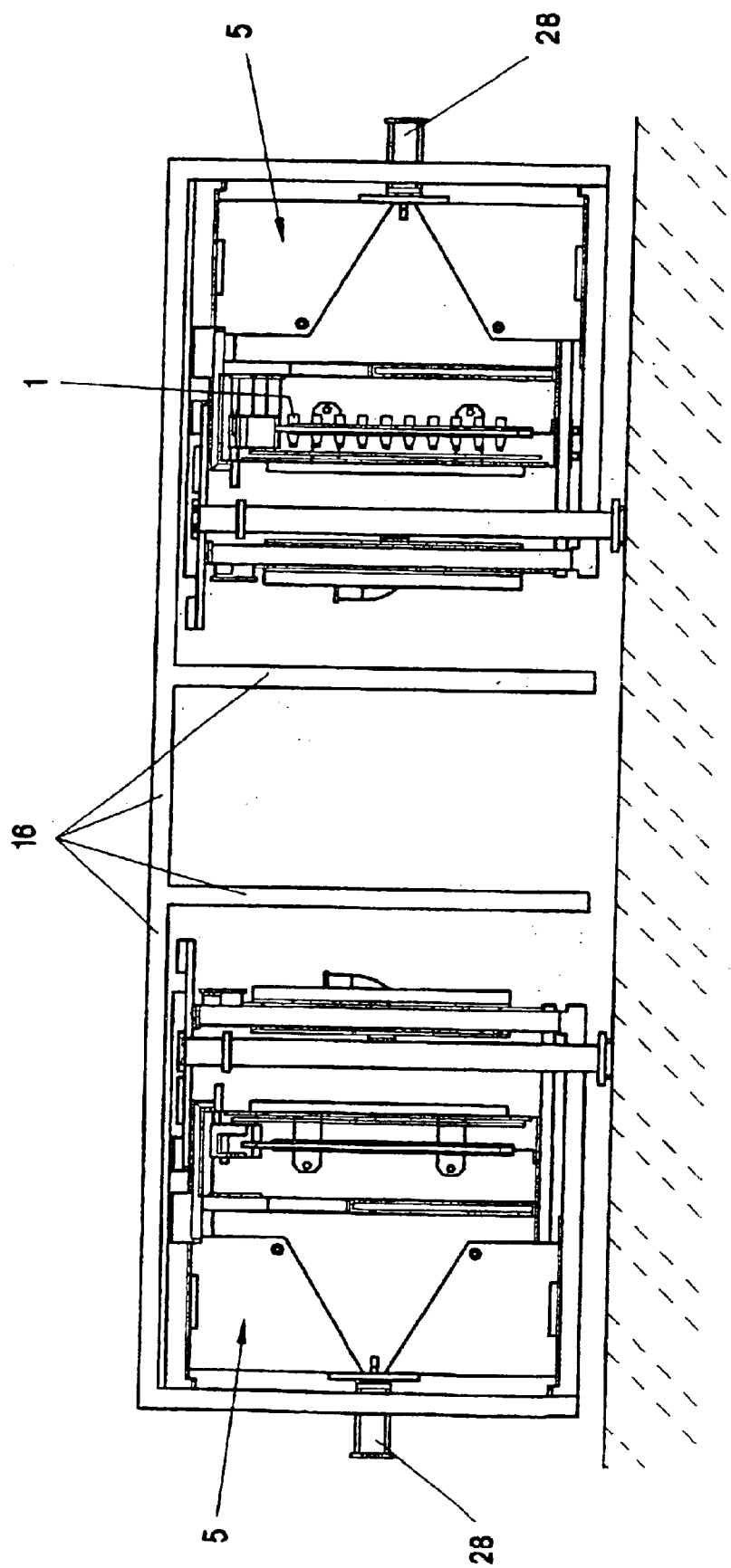
Figure 8:
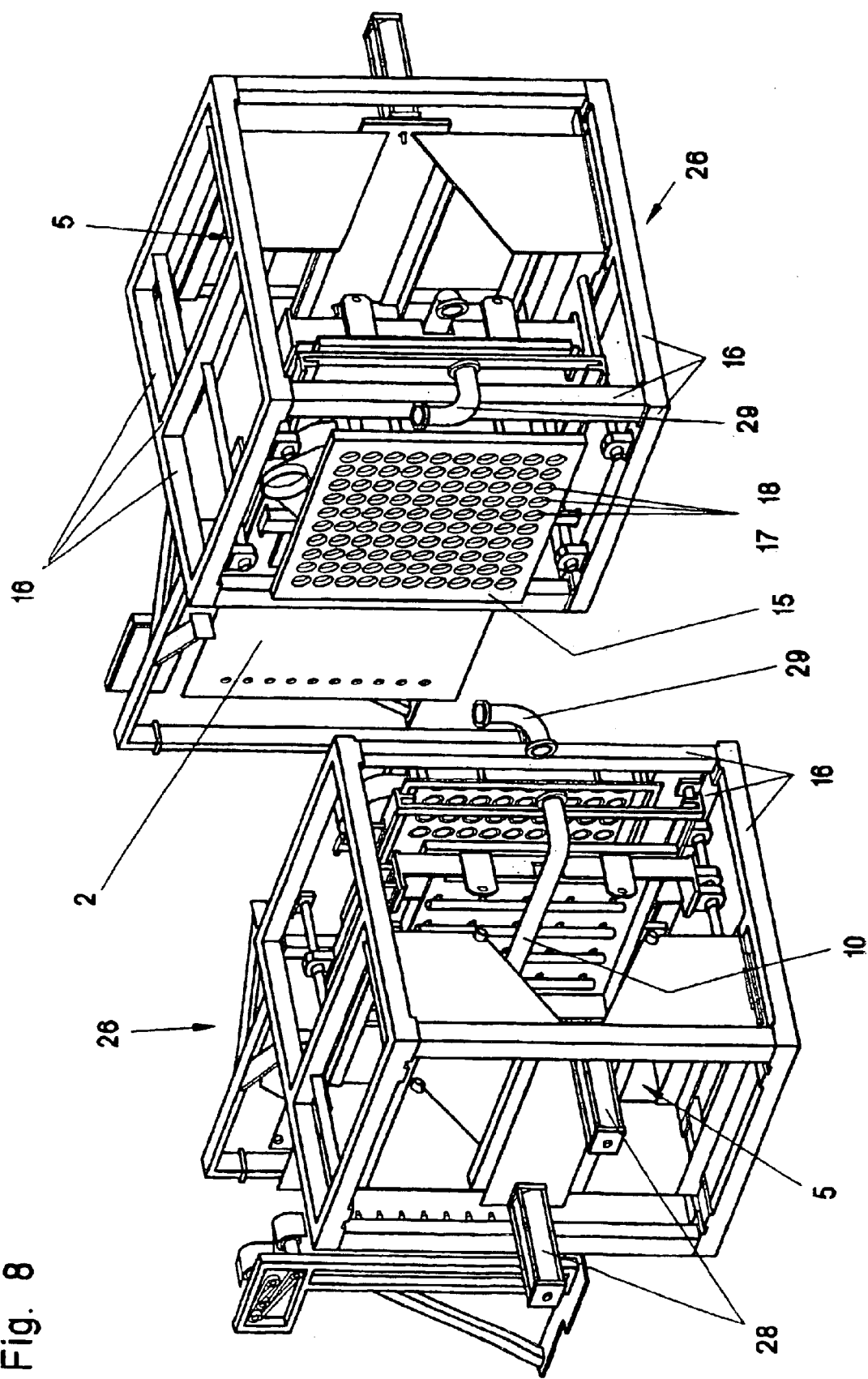
Figure 9:
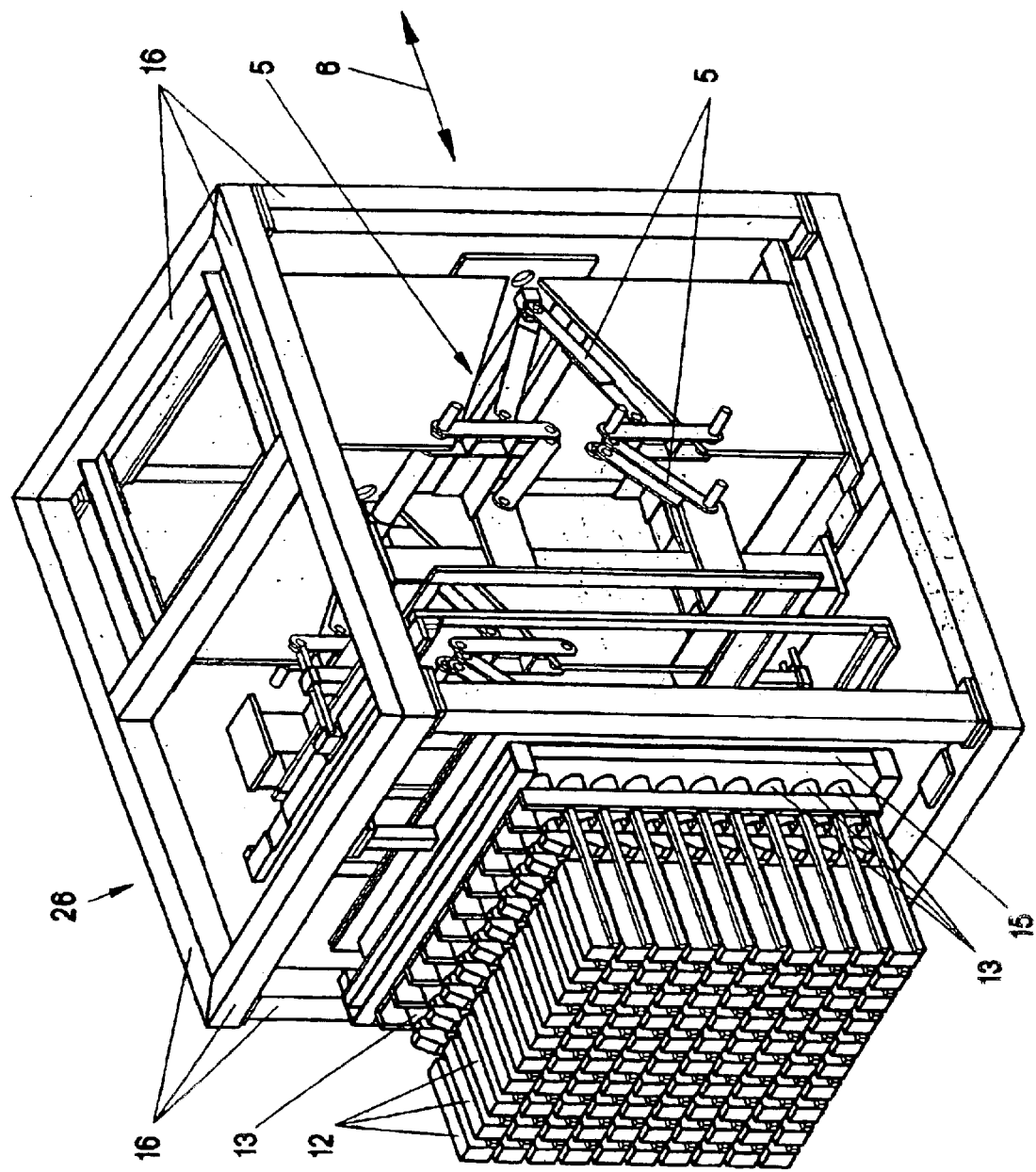
Figure 10A:
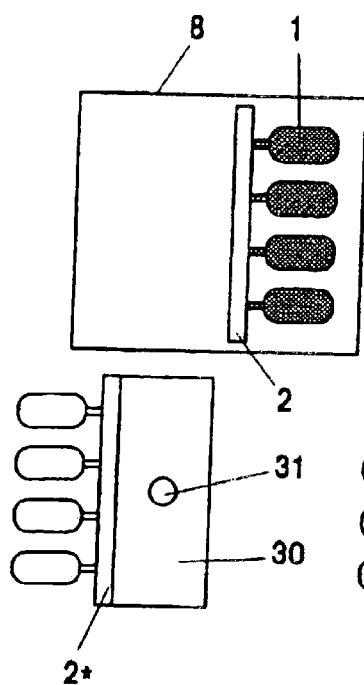

Further advantages, features and possible uses of the present invention will be apparent from the description hereinafter of preferred embodiments with reference to the accompanying drawings in which:

FIG. 1 diagrammatically shows a preferred embodiment of a coating machine having two modules which are arranged in mirror-image relationship with each other, in a first operating condition prior to loading of the treatment chamber, FIG. 2 is a broken-away view showing the upper part of the machine diagrammatically shown in FIG. 1, with the gas feed tubes already being introduced into the hollow bodies, FIG. 3 is a similar broken-away view to FIG. 2 but in a further operating condition in which the unit consisting of the carrier plate and the support plate is moved into the treatment chamber, FIG. 4 is an overall perspective view of a preferred embodiment of the coating machine with two modules with hollow body carrier plates, drives and microwave units arranged at the centre, FIG. 5 is a perspective rear view of the apparatus of FIG. 4, FIG. 6 is an isometric view of the machine frame, partly showing the mirror-image arrangement of the modules, FIG. 7 is a front view of the machine frame when viewing in FIG. 6 from left front to right rear, wherein a respective hydraulic unit for closing the treatment chamber is indicated at the right end of the machine frame and at the opposite left end thereof, FIG. 8 is a perspective view of two modules, omitting the connecting part of the machine frame, FIG. 9 is also a perspective view of the right-hand module shown in FIG. 8, with microwave units arranged in front thereof, and FIGS. 10a) to 10e) each diagrammatically show a plan view of the embodiment with a plate turner in different loadings positions.

The machine diagrammatically illustrated in FIG. 1 serves for simultaneously coating the internal surface of a plurality of hollow bodies 1 which are shown here in the form of bottles. The machine 1 is shown in plan, for which reason the view is onto the upper narrow longitudinal edge of a flat hollow body carrier plate 2 which is oriented vertically and which is to be envisaged as being movable in a horizontal direction towards the right or the left for loading and unloading purposes. Shown on a flat tube support plate 3 which is also oriented vertically is a row of three horizontally projecting gas feed tubes 4 which are disposed in parallel relationship. They can be moved into and out of the correspondingly arranged hollow bodies 1 in the direction of movement 6 (horizontal double-headed arrow) by a lever mechanism which is generally denoted by reference numeral 5 and which is most clearly indicated in the perspective view in FIG. 9.

The unit 7 which consists of the carrier plate 2 and the tube support plate 3 arranged in parallel relationship therewith and which has become a unit in FIG. 2 by being moved together is also movable into and out of the treatment chamber generally identified by reference numeral 8, in the direction of movement indicated by the arrow 6. The structure of the machine illustrated herein is designed in a dual fashion and practically symmetrically with respect to a central plane 9 (broken line in FIG. 1) which is to be imagined as extending vertically, in such a way that the same machine elements as described hereinbefore occur once again in mirror-image relationship. Therefore, in the lower half of FIG. 1, the elements identified by reference numerals 1–8 are correspondingly indicated but with the addition of a prime. Therefore, reference numeral 1' indicates hollow bodies, reference numeral 4' indicates gas feed tubes, and so forth. For the sake of simplicity, the description hereinafter is limited to one half of the machine 1.

The respective treatment chamber 8, 8' can be evacuated by way of conduits generally identified by reference numeral 10 and vacuum assemblies generally identified by reference numeral 11. Setting, monitoring and controlling the respective vacuum by way of valves and the like are known to the man skilled in the art and are not described in greater detail herein.

For each hollow body 1, the treatment chamber 8 is equipped with a microwave unit 12 with a resonator 13. An electrical power supply 14 (FIG. 1) is responsible for and feeds the entire packet of microwave units 12.

Also oriented vertically is a separating wall 15 which is fixed to the machine frame 16. This stationary separating wall 15 can be clearly seen for example at the right in FIG. 8. The separating wall 15 is provided with holes 17 arranged matrix-like in mutually juxtaposed relationship, with quartz windows 18. The separating wall 15 serves to define the treatment chamber 8 (for evacuation purposes) and by way of its holes 17 which are closed by way of quartz windows 18, it allows the microwave energy from the unit 12 into the treatment chamber 8 with the respective hollow body 1.

Finally in FIG. 1 reference numeral 19 shows a gas supply which, by way of tube connections 20 for the feed, supplies the tube support plate 3 and therewith the number of gas feed tubes 4 fixed thereto, with process gas. The process gas is emptied by way of the other tube connections 21 for the discharge thereof.

Operation of the machine, insofar as it can be described with reference to FIGS. 1 to 3, is such that firstly the hollow body carrier plate 2 is moved for example to the left or the right in a horizontal direction perpendicularly to the direction of movement 6, and there loaded at a plurality of fixing places 22 for the hollow bodies 1. Drives 23 shows in FIG. 4 then displace the hollow body carrier plate 2 in a direction parallel to the plane of the carrier plate 2 so that it then assumes the position shown in FIGS. 1 and 2. The hollow bodies 1 are fixed in a matrix-like configuration in a vertically upright position on the carrier plate 2 at the fixing places 22, with one row beside another. Then further drives move the tube support plate 3 with the gas feed tubes 4 in the direction of the double-headed arrow 6 so that the carrier plate 2 and the support plate 3 move closer towards each other, as shown in FIG. 2. The gas feed tubes 4 thus project into the hollow bodies 1, as shown in broken line in FIG. 2. Thereafter, that unit 7 comprising the carrier plate 2 and the support plate 3 moves into the stationary treatment chamber 8, thus reaching the condition shown in FIG. 3. The hollow bodies 1 are now supplied with process gas by way of the tube connections 20 while the air which was previously therein and thereafter also the process gas are withdrawn by way of the tube connection for the discharge 21. In parallel therewith the treatment chamber 8 is evacuated by means of the vacuum assemblies 11 by way of the line 10 in order to produce the required low pressure outside the hollow bodies. The electrical power supply 14 is switched on, the microwave units 12 with the microwave resonators 13 are switched on, and the gas mixture in the hollow bodies (with process gas) is put into the plasma state. The coating procedure is implemented in per se known manner, by way of plasma formation. Thereafter the unit 7 moves again upwardly in the direction of the arrow 6 horizontally out of the treatment chamber 8 so that once again the condition shown in FIG. 2 is reached. The tube support plate 3 with the gas feed tubes 4 is then released, to attain the position shown in FIG. 1. Thereafter the hollow body carrier plate 2 can be moved out horizontally towards the left or the right perpendicularly to the direction of movement 6, and a jolt device (not shown) releases the individual hollow bodies 1 from the carrier plate 2. The hollow bodies 1 drop down into a container which receives the coated hollow bodies and feeds them to the filling operation and so forth.

Details of the coating machine are shown more fully in FIGS. 4 to 9. Thus, FIGS. 4 and 5 show, of the vacuum assembly generally identified by reference numeral 11, the main pump set 24 which is arranged at the centre and the two process pump sets 25 which are arranged laterally thereof. The treatment chambers 8 which are subjected to the effect of vacuum by operation of those pumps 24, 25 are shown entirely without a housing and in an open condition, in order to clearly illustrate individual machine elements.

The overall perspective view in FIG. 4 shows from the front the hollow body carrier plates 2 which are extracted horizontally from the machine frame 16 by means of the drives 23 and which each carry 10×10 hollow bodies 1 in horizontal orientation. This view also shows one of the two hollow body carrier plates 2* which have already been moved into the machine. Disposed at the centre within the machine frame 16 is the packet of microwave units 12 which correspond in terms of number and arrangement to the 10×10 hollow bodies in the illustrated matrix. Each microwave unit 12 is indicated in the form of a long parallelepiped of square cross-section. This involves the housings which ensure the power supply for the magnetron (not shown) and which in operation generate heat, for which reason the individual microwave units 12 are arranged at a spacing from each other, as can be clearly seen.

The entire machine can be roughly divided into three portions, with the two end portions each forming a so-called module 26. This means that a separating wall 15, a hollow body carrier plate 2 and a tube support plate 3 are provided at each of the two end positions, and are disposed in mirror-image relationship with each other. It will be appreciated that the module 26 formed thereby also includes all functional accessories of the essential elements described and mentioned hereinbefore, for it will be appreciated that those elements must be fixed to the machine frame 16. Parts thereof must be capable of being moved and all elements require a supply for their function. That also includes the lever mechanism 5 which makes it possible to open and close the treatment chamber 8. Disposed in the central third portion are the microwave units 12 which are arranged in a matrix configuration and which are thus disposed in a common air-conditioning or climatising chamber with a cooling supply (not shown). It can be imagined that the cooling chamber begins in FIG. 9 to the left of the cuboidal machine frame 16 and provides for a flow of cooling fluid around the entire packet of the microwave units 12.

Numerous details are omitted from FIGS. 6 and 7 in regard to the mirror-image structure of the entire apparatus with the three portions, and for the sake of simplicity practically only the machine frame 16 with the two hollow body carrier plates 2 for the hollow bodies 1 is shown therein. The mirror-image structure is immediately apparent. In addition, a respective loading unit 21 for the hollow bodies 1 can be seen at each of the two carrier plates 2. The hollow bodies 1 are just being loaded into the respective carrier plate 2. FIG. 7 shows in a view which is true to scale a front view of the arrangement illustrated in FIG. 6. The two hydraulic rams 28 for the lever mechanisms 5 can be seen at the right-hand and left-hand ends. They provide for opening and closing the two treatment chambers 8.

FIG. 8 shows on the left the first module 26 and on the right the second module which is also identified by reference numeral 26. Only parts of the machine frame 16 (of cuboidal shape) are illustrated in order to make the Figure clearer. The respective treatment chamber 8 is shown in the opened condition. For that reason the conduits 10 for pumping out and generating the vacuum are also shown in broken-away form. It is even possible to see two bends 29 which so-to-speak are suspended in mid-air. It can however be readily imagined that in operation, upon closure of the treatment chambers 8 those conduits 10 will also be moved towards each other and closed. The right-hand half of FIG. 8 clearly shows the stationary separating wall 15 with the 10×10 circular holes 17 arranged in a matrix configuration. Disposed in those holes are quartz windows 18 which mechanically separate the microwave coupling-in effect from the actual evacuatable treatment chamber 8.

If the right-hand module in FIG. 8 is removed, the hollow body carrier plate 2 is moved into the operating condition and the block of microwave units 12 is fitted at the front onto the stationary separating wall 15, that then gives the perspective view of the right-hand module 26 shown in FIG. 9. FIG. 9 more clearly shows the lever mechanism 5 for opening and closing the treatment chamber 8. The hydraulic rams 28 for the movement drive are omitted here.

FIG. 10a) shows that operating position in which the hollow body carrier plate 2 is moved into the treatment chamber 8 for coating of the hollow bodies 1. A plate turner 30 is arranged outside the treatment chamber 8 (underneath in FIG. 10a)), pivotably about a vertical turning axis 31, and holds the other hollow body carrier plate 2* in the condition of just being in the process of being loaded with hollow bodies.

Figure 10B:
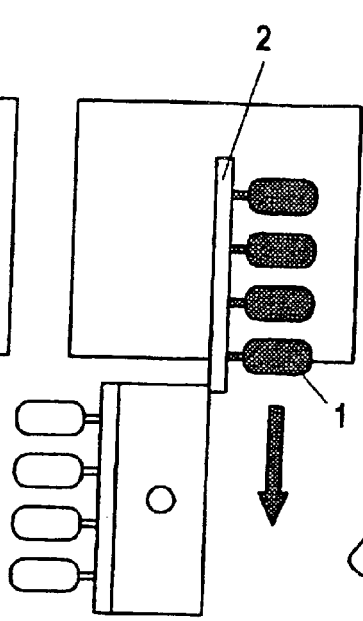

FIG. 10b) shows how the internally coated hollow bodies 1, by means of the carrier plate 2, are just beginning to move forwardly out of the treatment chamber 8, as indicated by the downwardly pointing arrow. Thereafter the carrier plate 2 comes to lie against the right-hand side of the plate turner 30 and is latched there.

Figure 10C:
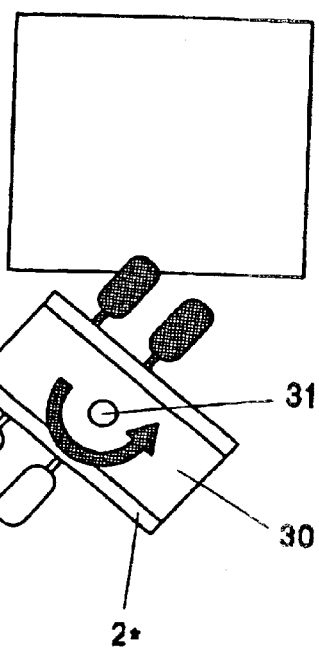
Figure 10D:
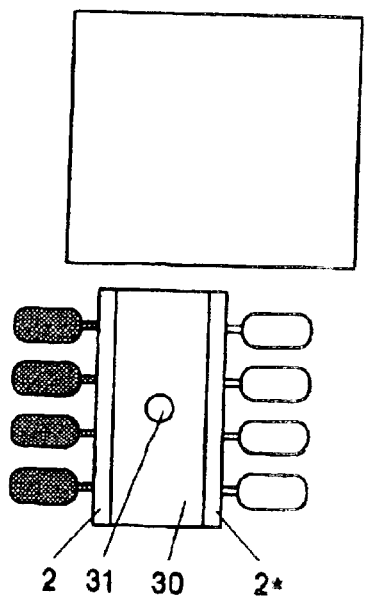
Figure 10E:
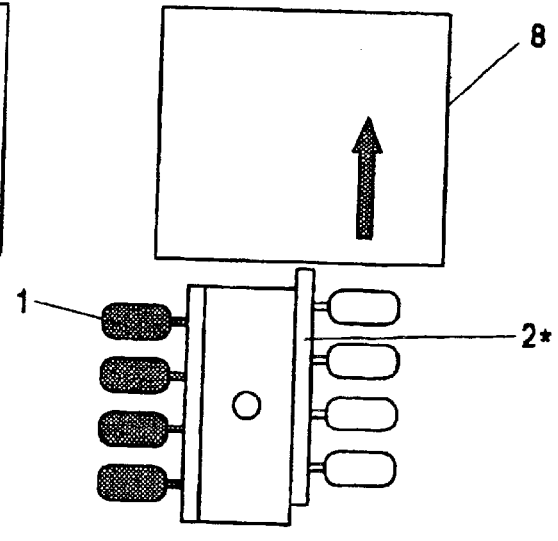

FIG. 10c) shows the operating condition in which the plate turner 30 is pivoted about its turning axis 31 in the direction of the curved arrow so that the non-coated hollow bodies move into the position shown in FIG. 10d). In the plan view onto the plate turner 30, the hollow body carrier plate 2* is at the right so that it can be released from the plate turner 30 and, in the operating condition shown in FIG. 10e), moved into the treatment chamber 8, in the direction of the upwardly pointing arrow. In the meantime the plate turner 30 remains outside and the coated hollow bodies 1 can be removed and replaced by uncoated hollow bodies. After the operation of coating the hollow bodies carried on the carrier plate 2*, the position shown in FIG. 10a) is then restored. The operating procedure is then repeated.

| List of references | |
|---|---|
| 1 | hollow body |
| 2, 2', 2* | hollow body carrier plate |
| 3 | tube support plate |
| 4 | gas feed tube |
| 5 | lever mechanism |
| 6 | direction of movement |
| 7 | unit comprising 2 and 3 |
| 8 | treatment chamber |
| 9 | notional vertical plane |
| 10 | conduit |
| 11 | vacuum assemblies |
| 12 | microwave unit |
| 13 | microwave resonator |
| 14 | electrical power supply |
| 15 | stationary separating wall |
| 16 | machine frame |
| 17 | hole in the separating wall 15 |
| 18 | quartz window |
| 19 | gas supply |
| 20 | tube connections for the feed |
| 21 | tube connections for the discharge |
| 22 | fixing place for hollow bodies |
| 23 | drive |
| 24 | main pump set |
| 25 | process pump set |
| 26 | module |
| 27 | loading unit |
| 28 | hydraulic ram |
| 29 | pipe bend |
| 30 | plate turner |
| 31 | turning axis |

What is claimed is:

1. A machine for simultaneously coating the internal surface of a plurality of hollow bodies (1) which are held on a vertically oriented substantially flat hollow body carrier plate (2) in such a way that a respective gas feed tube (4) for process gas which is secured to a vertically oriented substantially flat tube support plate (3) can be introduced into the hollow body (1) and the unit (7) comprising the carrier plate (2) and the support plate (3) arranged parallel thereto can be moved into and out of the respective evacuatable treatment chamber (8), wherein the treatment chamber (8) for each hollow body (1) is equipped with a microwave unit (12) with resonator (13), wherein;
   a. the hollow body carrier plate (2) with fixing places (22) arranged in mutually juxtaposed matrix-like relationship and the tube support plate (3) with gas feed tubes (4) arranged in corresponding relationship with respective ones of said fixing places (22) are oriented vertically;
   b. a vertically oriented separating wall (15), having holes (17) arranged in correspondingly matching matrix-like mutually juxtaposed relationship with the fixing places and quartz windows (18) for the holes, is fixed to the machine frame (16);
   c. the carrier plate (2) and the support plate (3) are provided with a drive (23) for horizontal movement thereof into the machine and out of the machine for loading and unloading;
   d. the separating wall (15), the hollow body carrier plate (2) and the tube support plate (3) with their functional accessories (5, 10, 11, 23–25) form a first module (26);
   e. fixed to the machine frame (16) in mirror-image relationship with the first module (26) is a second module (26) of corresponding structure; and
   f. the microwave units (12) arranged in matrix-like configuration are disposed between the modules (26).

2. A machine according to claim 1 wherein a common cooling arrangement is provided for both modules (26).

3. A machine according to claim 2 wherein common gas supply (19) is provided for both modules (26).

4. A machine according to claim 3 wherein for each hollow body (1) the microwave resonator (13) in question is in the form of a hollow cylinder fixed to the separating wall (15).

5. A machine according to claim 3 wherein the hollow body carrier plate (2) can be mounted tone side of a plate turner (30) which is pivotable about a vertical turning axis (31) and that a second hollow body carrier plate (2*) can be mounted on the other side of the plate turner (30).

6. A machine according to claim 2 wherein a common power supply (14) is provided for both modules (26).

7. A machine according to claim 6 wherein for each hollow body (1) the microwave resonator (13) in question is in the form of a hollow cylinder fixed to the separating wall (15).

8. A machine according to claim 2 wherein for each hollow body (1) the microwave resonator (13) in question is in the form of a hollow cylinder fixed to the separating wall (15).

9. A machine according to claim 2 wherein the hollow body carrier plate (2) can be mounted tone side of a plate turner (30) which is pivotable about a vertical turning axis (31) and that a second hollow body carrier plate (2*) can be mounted on the other side of the plate turner (30).

10. A machine according to claim 1 wherein common gas supply (19) is provided for both modules (26).

11. A machine according to claim 10 wherein a common power supply (14) is provided for both modules (26).

12. A machine according to claim 10 wherein for each hollow body (1) the microwave resonator (13) in question is in the form of a hollow cylinder fixed to the separating wall (15).

13. A machine according to claim 12 wherein the hollow body carrier plate (2) can be mounted tone side of a plate turner (30) which is pivotable about a vertical turning axis (31) and that a second hollow body carrier plate (2*) can be mounted on the other side of the plate turner (30).

14. A machine according to claim 10 wherein the hollow body carrier plate (2) can be mounted tone side of a plate turner (30) which is pivotable about a vertical turning axis (31) and that a second hollow body carrier plate (2*) can be mounted on the other side of the plate turner (30).

15. A machine according to claim 1 wherein a common power supply (14) is provided for both modules (26).

16. A machine according to claim 15 wherein for each hollow body (1) the microwave resonator (13) in question is in the form of a hollow cylinder fixed to the separating wall (15).

17. A machine according to claim 1 wherein for each hollow body (1) the microwave resonator (13) in question is in the form of a hollow cylinder fixed to the separating wall (15).

18. A machine according to claim 17 wherein for each hollow body (1) the microwave resonator (13) in question is in the form of a hollow cylinder fixed to the separating wall (15).

19. A machine according to claim 17 wherein the hollow body carrier plate (2) can be mounted tone side of a plate turner (30) which is pivotable about a vertical turning axis (31) and that a second hollow body carrier plate (2*) can be mounted on the other side of the plate turner (30).

20. A machine according to claim 1 wherein the hollow body carrier plate (2) can be mounted tone side of a plate turner (30) which is pivotable about a vertical turning axis (31) and that a second hollow body carrier plate (2*) can be mounted on the other side of the plate turner (30).

* * * * *